United States Patent [19]

Sato et al.

[11] Patent Number: 5,744,850
[45] Date of Patent: Apr. 28, 1998

[54] PHOTOELECTRIC CONVERSION SEMICONDUCTOR DEVICE

[75] Inventors: Keiji Sato; Yutaka Saitoh; Tadao Akamine, all of Chiba, Japan

[73] Assignee: Seiko Instruments R&D Center Inc., Japan

[21] Appl. No.: 733,967

[22] Filed: Oct. 18, 1996

[30] Foreign Application Priority Data

Oct. 20, 1995 [JP] Japan .................... 7-273133

[51] Int. Cl.$^6$ .................... H01L 31/107; H01L 31/075; H01L 31/105; H01L 31/117
[52] U.S. Cl. .................... 257/438; 257/458; 257/461
[58] Field of Search .................... 257/438, 458, 257/461

[56] References Cited

U.S. PATENT DOCUMENTS 5,021,854  6/1991  Huth .................... 257/438
5,345,103  9/1994  Aoki .................... 257/589

*Primary Examiner*—Stephen Meier
*Attorney, Agent, or Firm*—Adams & Wilks

[57] ABSTRACT

A novel photoelectric conversion semiconductor device having an amplifying function which can be readily fabricated is provided. An $N^+$-type impurity domain whose impurity concentration is higher than that of an $N^-$-type semiconductor substrate is formed on one surface thereof and a $P^+$-type impurity domain is formed on the opposite surface. An $SiO_2$ film, an $Si_3N_4$ film and an $SiO_2$ film are formed extending to the domain of the $N^-$-type semiconductor substrate, exceeding the $N^+$-type impurity domain. An anode electrode is formed on the $N^+$-type impurity domain and a cathode electrode is formed on the $P^+$-type impurity domain. A polysilicon gate electrode is formed on the $SiO_2$ film, i.e. the top layer, and an Al gate electrode is formed thereon. A reverse voltage is applied between the anode electrode and the cathode electrode and a predetermined voltage is applied between the anode electrode and the Al gate electrode.

6 Claims, 5 Drawing Sheets a

PHOTOELECTRIC CONVERSION SEMICONDUCTOR DEVICE

BACKGROUND OF THE INVENTION

The present invention relates to a photoelectric conversion semiconductor device having an amplifying function.

1. Description of Related Art

Hitherto, there has been known an avalanche photodiode as a photoelectric conversion semiconductor device having an amplifying function. As shown in a diagrammatic section view in FIG. 10, the avalanche photodiode is fabricated by forming an $N^+$-type impurity domain 22 whose edge diffusion depth is deepened to increase a break-down voltage and a $P^+$-type impurity domain 23 which is separated from the domain 22 so as to surround it and which functions as a channel stopper on the surface of a P-type semiconductor substrate 21, by forming a P-type impurity domain 24 which performs the avalanche amplification under the N+-type impurity domain 22 and by forming a $P^+$-type impurity domain 25 on the opposite side of the substrate.

The avalanche photodiode having such structure has advantages that its sensitivity is high and speed is fast.

However, it has been difficult to fabricate such avalanche photodiode as described above because it has been not so easy, in terms of the fabrication, to form a predetermined concentration distribution for causing the amplification and the break-down has tended to occur at other places than the light receiving surface.

Accordingly, it is an object of the present invention to obtain a novel photoelectric conversion semiconductor device having an amplifying function which overcomes the aforementioned problems.

SUMMARY OF THE INVENTION

In order to solve the aforementioned problems, the present invention is arranged, as first means, such that an $N^+$-type impurity domain and an anode electrode as its electrode are formed on one surface of an $N^-$-type semiconductor substrate, a $P^+$-type impurity domain and a cathode electrode are formed on the other surface on the opposite side, a gate electrode is formed on the $N^+$-type impurity domain via a dielectric layer and the dielectric layer is formed so as to extend to the domain of the $N^-$-type semiconductor substrate, exceeding the $N^+$-type impurity domain.

As second means, a bias voltage is applied to the anode electrode and the gate electrode such that the voltage applied to the anode electrode>voltage applied to the gate electrode.

As third means, a gate electrode is formed also on the $P^+$-type impurity domain via another dielectric layer.

As fourth means, a signal output terminal is provided on the gate electrode formed on the dielectric layer on the $N^+$-type impurity domain to output signals.

As fifth means, the dielectric layer is composed of an oxide film and a nitride film.

As sixth means, the dielectric layer is constructed by a three-layered structure of an oxide film, a nitride film and an oxide film.

The above and other related objects and features of the present invention will be apparent from a reading of the following description of the disclosure found in the accompanying drawings in which like numerals refer to like parts.

DESCRIPTION OF PREFERRED EMBODIMENTS

Preferred embodiments of the present invention will be explained below with reference to the drawings.

Figure 1:
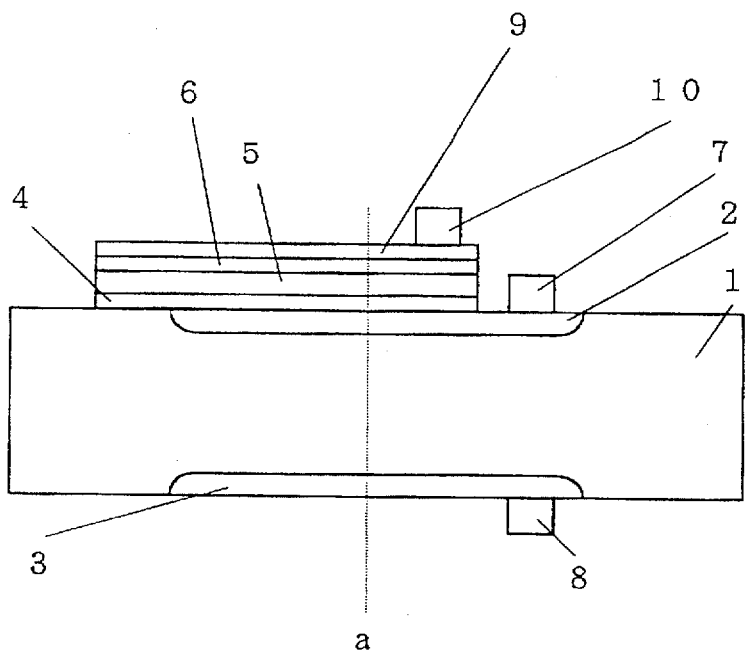
FIG. 1 is a diagrammatic section view of a semiconductor device according to a first embodiment of the present invention.
Figure 2:
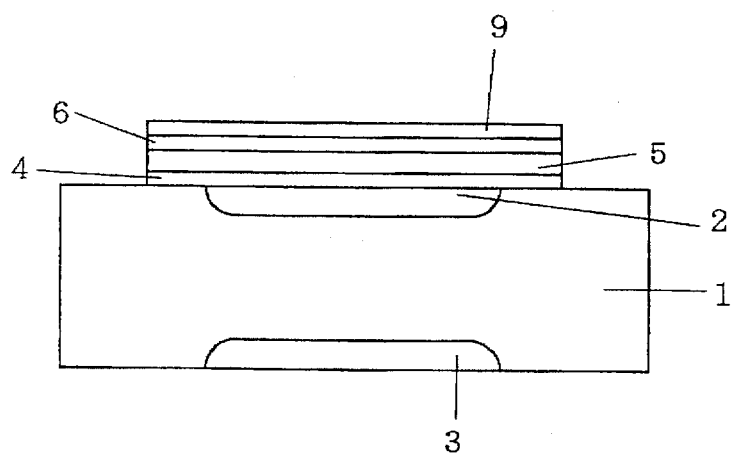
FIG. 2 is a diagrammatic section view of the semiconductor device of the first embodiment of the present invention.

FIG. 1 is a diagrammatic section view of a semiconductor device according to a first embodiment of the present invention and FIG. 2 is a diagrammatic section view taken along a line a in FIG. 1.

An $N^+$-type impurity domain 2 whose impurity concentration is higher than that of an $N^-$-type semiconductor substrate 1 is formed on one surface thereof and a $P^+$-type impurity domain 3 is formed on the surface of the opposite side. A thin $SiO_2$ film 4 is formed on the $N^+$-type impurity domain 2 and an $Si_3N_4$ film 5 and an $SiO_2$ film 6 are formed thereon in that order, A dielectric layer having a three-layered structure of the $SiO_2$ film 4, the $Si_3N_4$ film 5 and the $SiO_2$ film 6 extends to the domain of the $N^-$-type semiconductor substrate, i.e. to the $N^-$-type domain of the substrate, exceeding the $N^+$-type impurity domain.

An anode electrode 7 is formed on the $N^+$-type impurity domain 2 and a cathode electrode 8 is formed on the $P^+$-type impurity domain 3 by Al.

A polysilicon gate electrode 9 is formed on the $SiO_2$ film 6, i.e. the top layer of the dielectric layer, and an Al gate electrode 10 is formed thereon.

A reverse voltage for extending a depletion layer (hereinafter referred to as a reverse voltage) is applied between the anode electrode 7 and the cathode electrode 8 and a predetermined voltage (hereinafter referred to as a gate voltage) is applied between the anode electrode 7 and the gate electrode 10.

An output is read in terms of capacity from the Al gate electrode 10.

Figure 3:
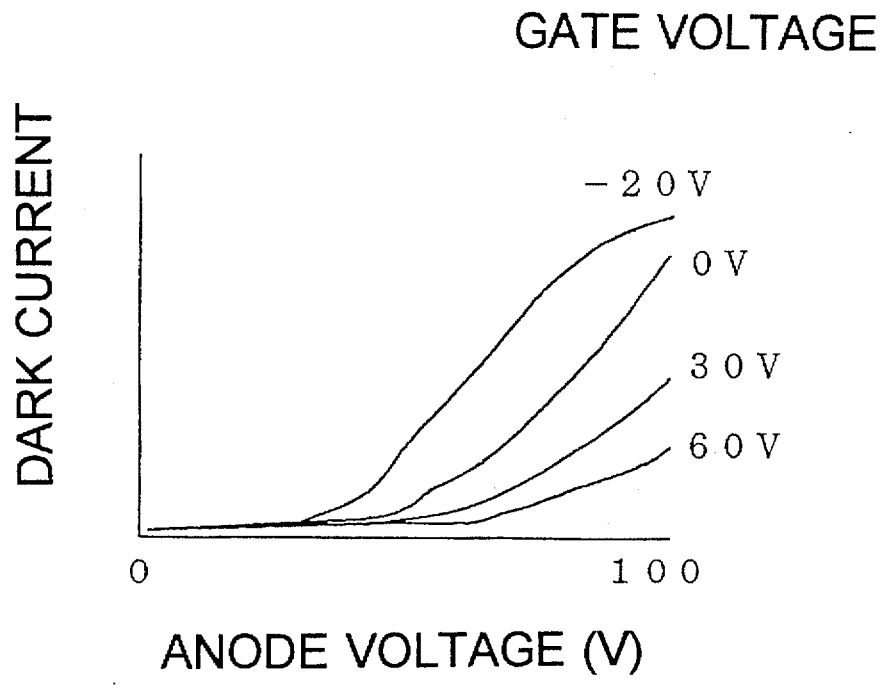
FIG. 3 is a graph of a characteristic of reverse voltage and dark current of the semiconductor device of the first embodiment of the present invention.

FIG. 3 is a graph showing a characteristic of the reverse voltage and dark current of the PN junction of the semiconductor device of the first embodiment shown in FIG. 1 when the gate voltage is changed. At this time, the cathode electrode 8 is grounded.

It can be seen from FIG. 3 that the dark current increases sharply from a certain reverse voltage under a specific gate voltage. Further, it can be seen that the higher the gate voltage, the higher the reverse voltage that increases the dark current becomes.

Figure 4:
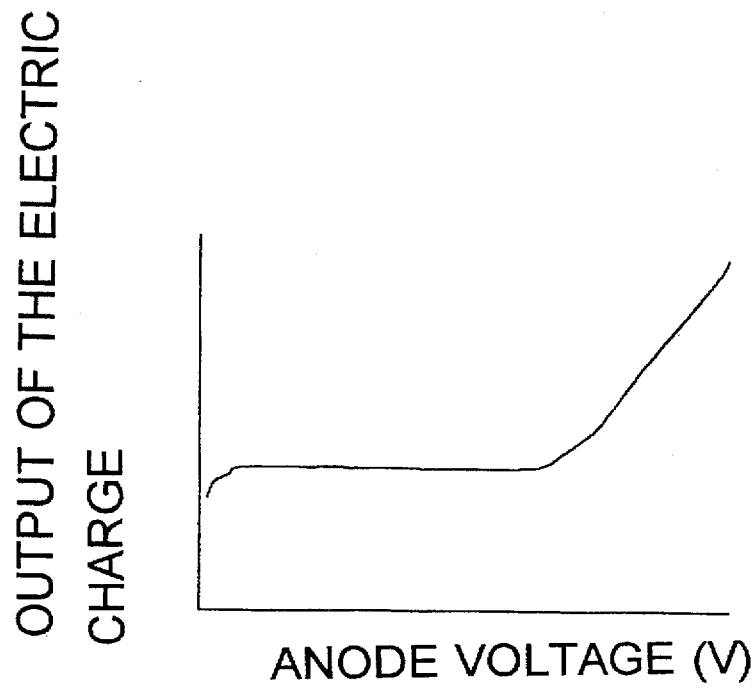
FIG. 4 is a graph of a characteristic of the reverse voltage and dark current of the semiconductor device of the first embodiment when laser beam is irradiated.

FIG. 4 is a graph showing a characteristic of the reverse voltage and output of the semiconductor device when laser beam having a certain intensity is irradiated under a certain gate voltage. An output is read in terms of electric charge through the Al gate electrode. It can be seen from FIG. 4 that the output of the electric charge increases sharply from the reverse voltage that causes the dark current to increase and that the amplification occurs.

While the dielectric layer has had the three-layered structure of the oxide film, nitride film and oxide film in the embodiment described above, it is preferable to have the nitride film from the aspect of a withstand voltage because the dielectric layer would have a problem that the withstand voltage as the dielectric layer is small if it is formed of only one layer of the oxide film. At this time, the better dielectric layer is obtained by forming the nitride film after forming the thin oxide film and the best dielectric layer may be obtained by the three-layered structure of the oxide film, nitride film and the oxide film.

Figure 5:
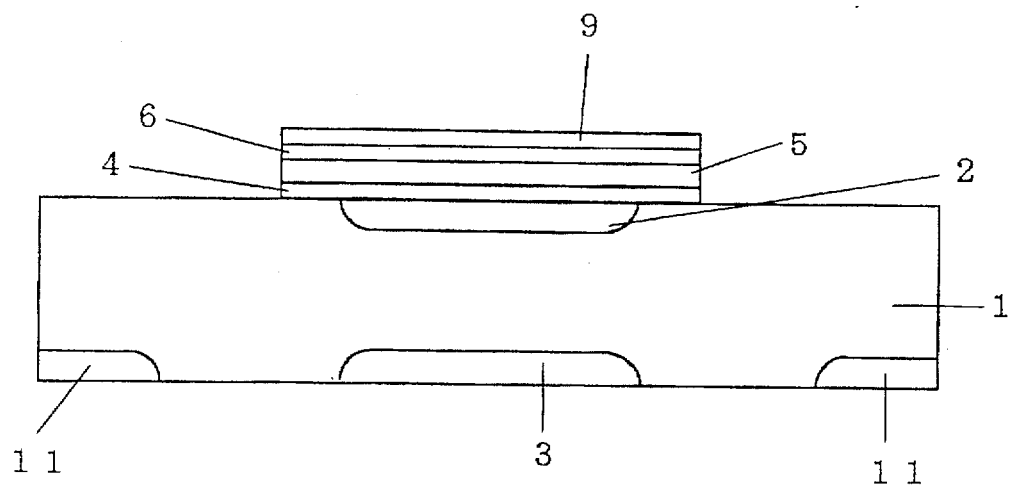
FIG. 5 is a diagrammatic section view of a semiconductor device according to a second embodiment of the present invention.

FIG. 5 is a diagrammatic section view of a semiconductor device according to a second embodiment of the present invention, wherein a second $N^+$-type impurity domain 11 is formed on the surface where the $P^+$-type impurity domain 3 is formed. The dark current may be reduced by constructing this way.

Figure 6:
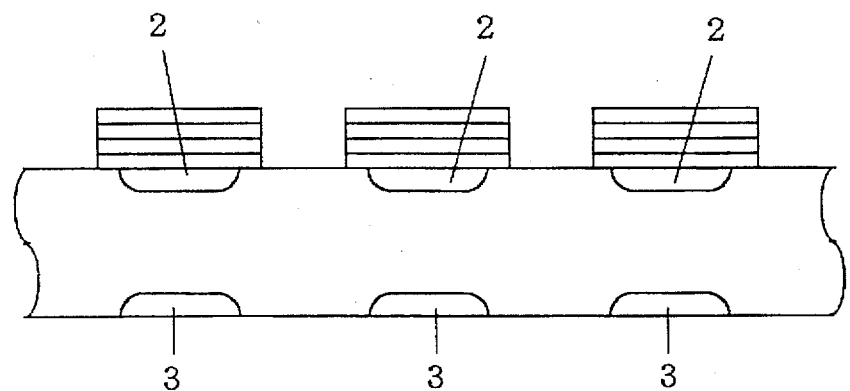
FIG. 6 is a diagrammatic section view of a semiconductor device according to a third embodiment of the present invention.

FIG. 6 is a diagrammatic section view of a semiconductor device according to a third embodiment of the present invention, wherein the $N^+$-type impurity domain 2 and the $P^+$-type impurity domain 3 are divided into a number of strips, Thereby, a photoelectric conversion semiconductor device having one-dimensional amplifying function may be obtained.

Figure 7:
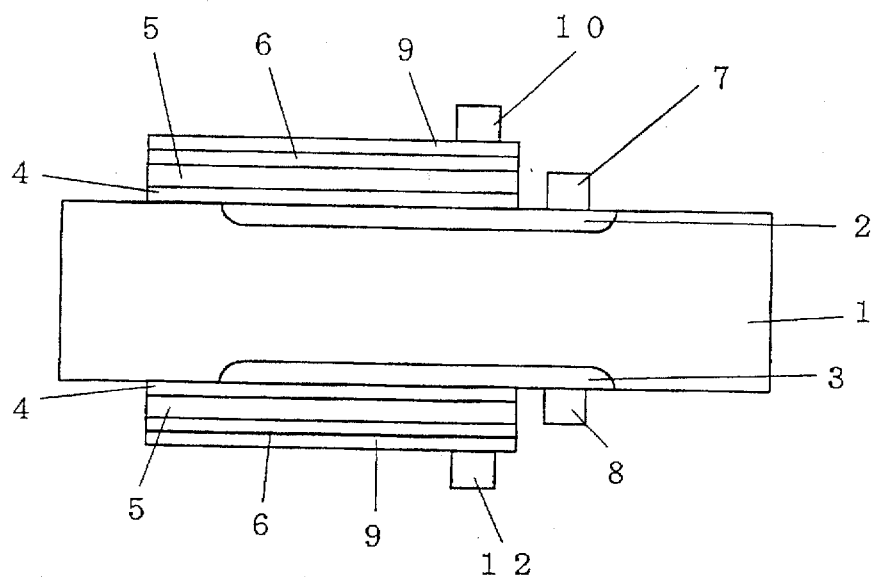
FIG. 7 is a diagrammatic section view of a semiconductor device according to a fourth embodiment of the present invention.

FIG. 7 is a diagrammatic section view of a semiconductor device according to a fourth embodiment of the present invention, wherein another polysilicon gate electrode 9 and a second Al gate electrode 12 are formed also on the $P^+$-type impurity domain 3 via another dielectric layer of the three-layered structure of the $SiO_2$ film 4, the $Si_3N_4$ film 5 and the $SiO_2$ film 6. The cathode electrode 8 is also formed thereon.

Thereby, it becomes possible to read from the both Al gate electrodes 10 and 12.

Figure 8:
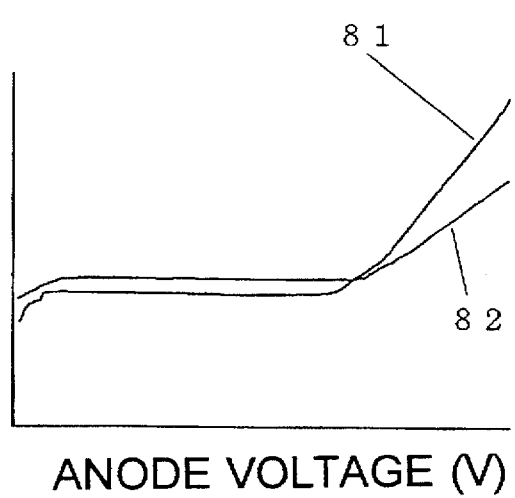
FIG. 8 is a graph of a characteristic of reverse voltage and dark current of the semiconductor device of the fourth embodiment when laser beam is irradiated.

FIG. 8 is a graph showing a characteristic of the reverse voltage and dark current of the semiconductor device of the fourth embodiment when laser beam having a constant intensity is irradiated under a certain gate voltage. Its output is read in terms of electric charge.

No bias voltage is applied to the second Al gate electrode formed on the $P^+$-type impurity domain and a bias voltage is applied only to the Al gate electrode formed on the $N^+$-type impurity domain. The cathode electrode 8 is grounded.

An output characteristic curve 81 represents an output from the Al gate electrode and an output characteristic curve 82 represents an output from the second Al gate electrode. It can be seen from the figure that an amplification factor of the output from the Al gate electrode formed on the $N^+$-type impurity domain is greater that the other.

Figure 9:
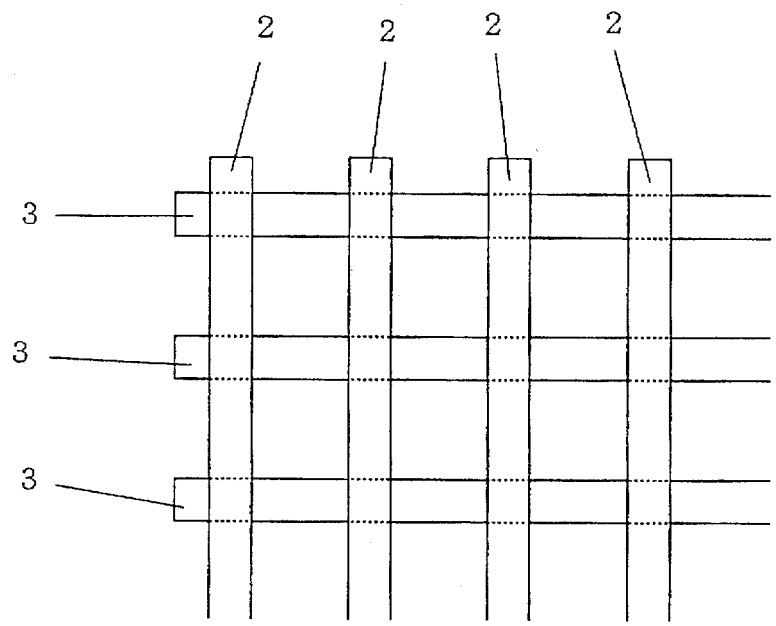
FIG. 9 is a diagrammatic plan view of a semiconductor device according to a fifth embodiment of the present invention.
Figure 10:
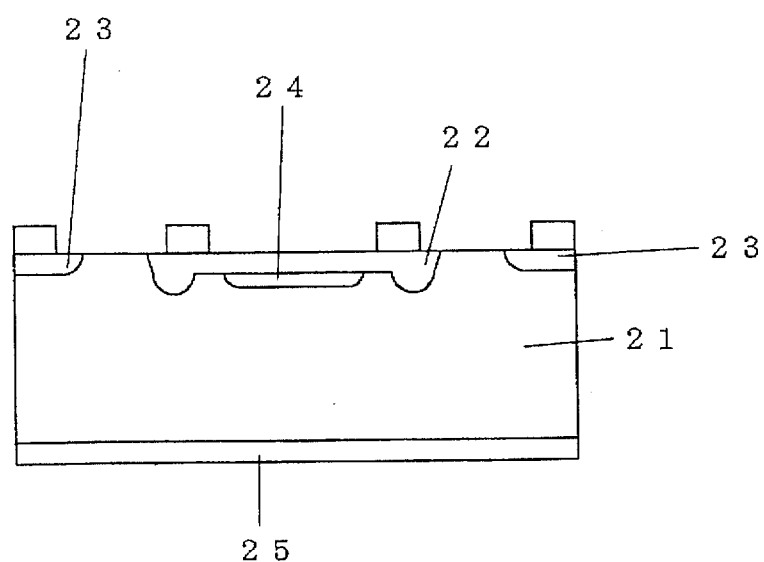
FIG. 10 is a diagrammatic section view of an avalanche photo-diode.

FIG. 9 is a diagrammatic plan view of a semiconductor device according to a fifth embodiment of the present invention. In the figure, only the $N^+$-type impurity domain 2 and the $P^+$-type impurity domain 3 are shown in order to make it to be readily understood.

The $N^+$-type impurity domain 2 and the $P^+$-type impurity domain 3 are divided into a number of strips such that those strips of the $N^+$-type impurity domain 2 and the $P^+$-type impurity domain 3 cross at right angles each other.

Further, similarly to the fourth embodiment, the dielectric layers and the gate electrodes are formed on the $N^+$-type impurity domain 2 and the $P^+$-type impurity domain 3, respectively. Thereby, a two-dimensional photoelectric conversion semiconductor device having an amplifying function may be obtained.

As described above, the present invention allows the novel photoelectric conversion semiconductor devices having the amplifying function to be obtained.

While preferred embodiments have been described, variations thereto will occur to those skilled in the art within the scope of the present inventive concepts which are delineated by the following claims.

What is claimed is:

1. A photoelectric conversion semiconductor device, comprising:

first conductive impurity domain having an impurity concentration higher than that of a first conductive semiconductor substrate and formed on one surface of said first conductive semiconductor substrate;

a second conductive impurity domain formed on the other surface of said first conductive semiconductor substrate on the side opposite from the surface having said first conductive impurity domain;

a first electrode formed on said first conductive impurity domain and a second electrode formed thereon via a dielectric layer; and a third electrode formed on said second conductive impurity domain;

said dielectric layer extending to the domain of said first conductive semiconductor substrate.

2. The photoelectric conversion semiconductor device according to claim 1, further comprising a fourth electrode formed on said second conductive impurity domain via another dielectric layer.

3. The photoelectric conversion semiconductor device according to claim 1, wherein at least one of a signal output terminal is connected to said second electrode.

4. The photoelectric conversion semiconductor device according to claim 1, wherein said dielectric layer is composed of an oxide film and an nitride film.

5. The photoelectric conversion semiconductor device according to claim 1, wherein said dielectric layer is composed of an oxide film, an nitride film and an oxide film.

6. A method for driving a photoelectric conversion semiconductor device, comprising:

first conductive impurity domain whose impurity concentration is higher than that of a first conductive semiconductor substrate and formed on one surface of said first conductive semiconductor substrate;

a second conductive impurity domain formed on the other surface of said first conductive semiconductor substrate on the side opposite from the surface having said first conductive impurity domain;

a first electrode formed on said first conductive impurity domain and a second electrode formed thereon via a dielectric layer; and a third electrode formed on said second conductive impurity domain;

said dielectric layer extending to the domain of said first conductive semiconductor substrate;

said method for driving said photoelectric conversion semiconductor device being characterized in that a potential of said first electrode is increased so as to be higher than that of said second electrode.

* * * * *